United States Patent [19]

Shah et al.

[11] Patent Number: 5,517,594
[45] Date of Patent: May 14, 1996

[54] THERMAL REACTOR OPTIMIZATION

[75] Inventors: Sunil C. Shah, Mountain View; Pradeep Pandey, San Jose, both of Calif.

[73] Assignee: Relman, Inc., Mountain View, Calif.

[21] Appl. No.: 324,416

[22] Filed: Oct. 17, 1994

[51] Int. Cl.$^6$ .............................. H05B 1/02; C23C 14/54
[52] U.S. Cl. .......................... 392/416; 219/494; 118/50.1; 118/725; 364/477
[58] Field of Search .................................... 392/416, 418; 219/405, 411, 494; 118/50.1, 724, 725; 367/477, 557

[56] References Cited

U.S. PATENT DOCUMENTS

| | | | |
|---|---|---|---|
| 4,276,603 | 6/1981 | Beck et al. | 364/477 |
| 4,688,180 | 8/1987 | Motomiya | 364/477 |
| 4,711,989 | 12/1987 | Yu | 219/390 |
| 4,761,538 | 8/1988 | Chiba et al. | 219/497 |
| 4,937,434 | 6/1990 | Nakao | 219/390 |
| 5,099,442 | 3/1992 | Furuta et al. | 364/557 |
| 5,258,601 | 11/1993 | Takano | 219/486 |
| 5,280,422 | 1/1994 | Moe et al. | 364/140 |
| 5,291,514 | 3/1994 | Heitmann et al. | 373/135 |

OTHER PUBLICATIONS

G. F. Franklin, J. Powell, and M. Workman, "Digital Control of Dynamic Systems", pp. 349–483, Addison–Wesley, 1990.
L. Ljung, "System Identification, Theory for the User", pp. 115–127, Prentice Hall, 1987.
B. D. O. Anderson and J. B. Moore, "Optimal Control: Linear Quadratic Methods", pp. 262–289, Prentice Hall, 1989.
A. Bryson and Y. C. Ho, "Applied Optimal Control", pp. 42–127, Halsted Press, 1975.
Y. M. Cho and T. Kailath, "Model Identification in Rapid Thermal Processing Systems", IEEE Semiconductor Manufacturing, vol. 6, No. 3, pp. 216–229, Aug. 1993.
C. M. Schaper, M. Moslehi, K. Saraswat, and T. Kailath, "Modeling, Identification, and Control of Rapid Thermal Processing Systems", pp. 1–29, Tables 1–5, and FIGS. 1–33, submitted to Journal of the Electromechanical Society, Sep. 1993.
S. Hirasawa, et al., "Temperature Distribution in Semiconductor Wafers Heated in a Vertical Diffusion Furnace", IEEE Trans. Semiconductor Manufacturing, vol. 6, No. 3, pp. 226–232, Aug. 1993.
S. A. Norman, "Optimization of Transient Temperature Uniformity in RTP System", IEEE Trans. Electron Devices, vol. 39, No. 1, pp. 205–207, Jan. 1992.
C. M. Schaper, M. Moslehi, K. Saraswat, T. Kailath, "Control of MMST RTP: Repeatability, Uniformity, and Integration for Flexible Manufacturing", pp. 1–24, Table 1, and FIGS. 1–28, submitted to IEEE Trans. Semiconductor Manufacturing, Sep. 1993.
H. De Waard, and W. L. De Konig, "Adaptive Temperature Control of Industrial Diffusion/LPCVD Reactors", pp. 289–294, IFAC Intelligent Tuning and Adaptive Control, Singapore, 1991.
H. De Waard, and W. L. De Konig, "Optimal Control of the Wafer Temperatures in Diffusion/LPCVD Reactors", Automatica, vol. 28, No. 2, pp. 243–253, 1992.

Primary Examiner—Teresa J. Walberg
Assistant Examiner—J. Pelham
Attorney, Agent, or Firm—Blakely, Sokoloff, Taylor & Zafman

[57] ABSTRACT

A system for controlling a thermal reactor is disclosed that characterizes the thermal reactor with a reactor model that indicates behavior of the thermal reactor and of a load contained in the thermal reactor and that accounts for interaction among a set of heating zones of the thermal reactor. An online reactor model is then determined that estimates the thermal behavior of the load based upon an online input power to the thermal reactor and upon an online temperature indication from the thermal reactor. A time varying temperature and reactant flow recipe is determined that minimizes end of run parameters on the load. A multivariable controller is employed to minimize temperature deviations of the load from a predetermined temperature recipe or time varying trajectory.

45 Claims, 7 Drawing Sheets

THERMAL REACTOR OPTIMIZATION

BACKGROUND OF THE INVENTION

1. Field of the Invention

The present invention pertains to the field of thermal processes. More particularly, this invention relates to the optimization of thermal reactor or diffusion furnace performance for thermally activated processes.

2. Background

Thermally activated processes typically require highly uniform thermal processing control to achieve maximum efficiency. For example, integrated circuit chips typically comprise a set of layered structures formed on a silicon substrate via thermally activated processes. The layered structures usually include, for example, polysilicon structures, oxide structures, and diffusion regions. Typically, such structures are formed on a silicon wafer substrate in a controlled thermal reactive environment suitable for forming the required structures on the silicon wafers.

Typically, such a controlled reactive environment is provided by a thermal reactor. Such thermal reactors are also referred to as diffusion furnaces. A typical prior thermal reactor includes a quartz jar that contains a set of silicon wafers. Such a thermal reactor usually includes a set of heating elements that surround the quartz jar. The heating elements in such a thermal reactor usually subdivide the thermal reactor into a set of thermal zones. The heating elements for the thermal zones are usually separately controllable.

Prior thermal reactor systems usually include a reactor controller that controls the heating elements of the thermal reactor as well as the pressure and flow rates of reactive gasses in the thermal reactor. Typically, the deposition rate of polysilicon structures and oxide structures and the rate of growth of diffusion regions on the silicon wafers are related to the wafer temperature. As a consequence, prior reactor controllers usually attempt to achieve the desired end of run physical parameters for the structures formed on the silicon wafers by monitoring and adjusting the temperature and gas flows of the thermal reactor during deposition.

Such prior reactor controllers typically monitor the temperature of the thermal reactor via online temperature measurements. Typically, such online temperature measurements are obtained with thermocouples positioned within or near the quartz jar and with thermocouples inserted through the heating elements of the thermal reactor.

In addition, such prior reactor controllers typically employ proportional integral derivative (PID) methods to control the temperature of the silicon wafers. Such PID reactor controllers usually obtain temperature measurements from the thermocouples in the thermal reactor as an indication of the temperature of the silicon wafers in the quartz jar. Typically, such PID reactor controllers adjust heater power control signals to the thermal reactor to maintain a set point temperature according to a predetermined process control recipe.

Unfortunately, such thermocouple measurements provide a reasonable indication of silicon wafer temperatures only after a long stabilization period in the thermal reactor. Such a long thermal reactor stabilization period typically increases the total cycle time for forming structures on the silicon wafers load. Such increased cycle time usually increases the cost of manufacturing integrated circuit chips. Moreover, such a protracted thermal reactor stabilization period becomes an increasingly larger portion of total cycle time as wafer processes evolve that require shorter intervals for formation of structures. Also, such a protracted thermal reactor stabilization period becomes a larger portion of total cycle time as the thermal mass in the thermal reactor increases. Such increased stabilization period also results in unwanted diffusion of dopants creating difficulty in making sub-micron devices.

In addition, such prior PID reactor controllers cannot accurately control the thermal gradients that occur along the major axis of the thermal reactor. As a consequence, silicon wafers located at different positions along the axis of the thermal reactor are exposed to differing temperatures during thermal processing. Moreover, such prior PID reactor controllers cannot accurately control the thermal gradients that occur radially on the silicon wafers. As a result, integrated circuit chips located at differing radial positions on a given silicon wafer are exposed to differing temperatures during thermal processing.

Unfortunately, such differing temperatures during processing causes variations in the end of run physical parameters of the processed wafers. Such variations in end of run wafer parameters typically decreases the overall yield of such a manufacturing process. Moreover, such a decrease in yield increases the overall cost of manufacturing such integrated circuit chips.

SUMMARY AND OBJECTS OF THE INVENTION

One object of the present invention is to improve the utility of thermal reactors used in thermally activated processes.

Another object of the present invention is to optimize thermal reactor performance for thermally activated processes employed in semiconductor manufacture.

Another object of the present invention is to decrease the total cycle time for forming structures on integrated circuit chips in a thermal reactor.

Another object of the present invention is to decrease the cost of manufacturing integrated circuit chips.

A further object of the present invention is to provide an accurate indication of wafer load temperatures in a thermal reactor.

Another object of the present invention is to exploit thermal gradients that occur in a thermal reactor to reduce end of run physical parameter variations in integrated circuit chips.

Another object of the present invention is to accurately characterize the thermal behavior of a thermal reactor.

A further object of the present invention is to develop an online model of thermal reactor behavior and to employ online multi-variable control of the thermal reactor.

Another object of the present invention is to optimize thermal reactor performance for flat-panel display manufacture and photovoltarc manufacture.

These and other objects of the invention are provided by a system for controlling a thermal reactor that determines a reactor model that indicates a thermal behavior of the thermal reactor and a thermal behavior of a wafer load contained in the thermal reactor. The reactor model accounts for interaction among a set of heating zones of the thermal reactor. An online reactor model is then determined from the reactor model. The online reactor model estimates the thermal behavior of the wafer load based upon an online input power to the thermal reactor and upon an online temperature indication from the thermal reactor. A multi-variable controller is then determined from the online reactor model. The multi-variable controller minimizes temperature deviations for the wafer load from a predetermined temperature recipe or time varying trajectory. The time varying trajectory is determined to minimize end of the run variations in film properties and reduced cycle time. The online reactor model and the multi-variable controller are employed in an online thermal reactor control system that optimizes thermal reactor performance.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
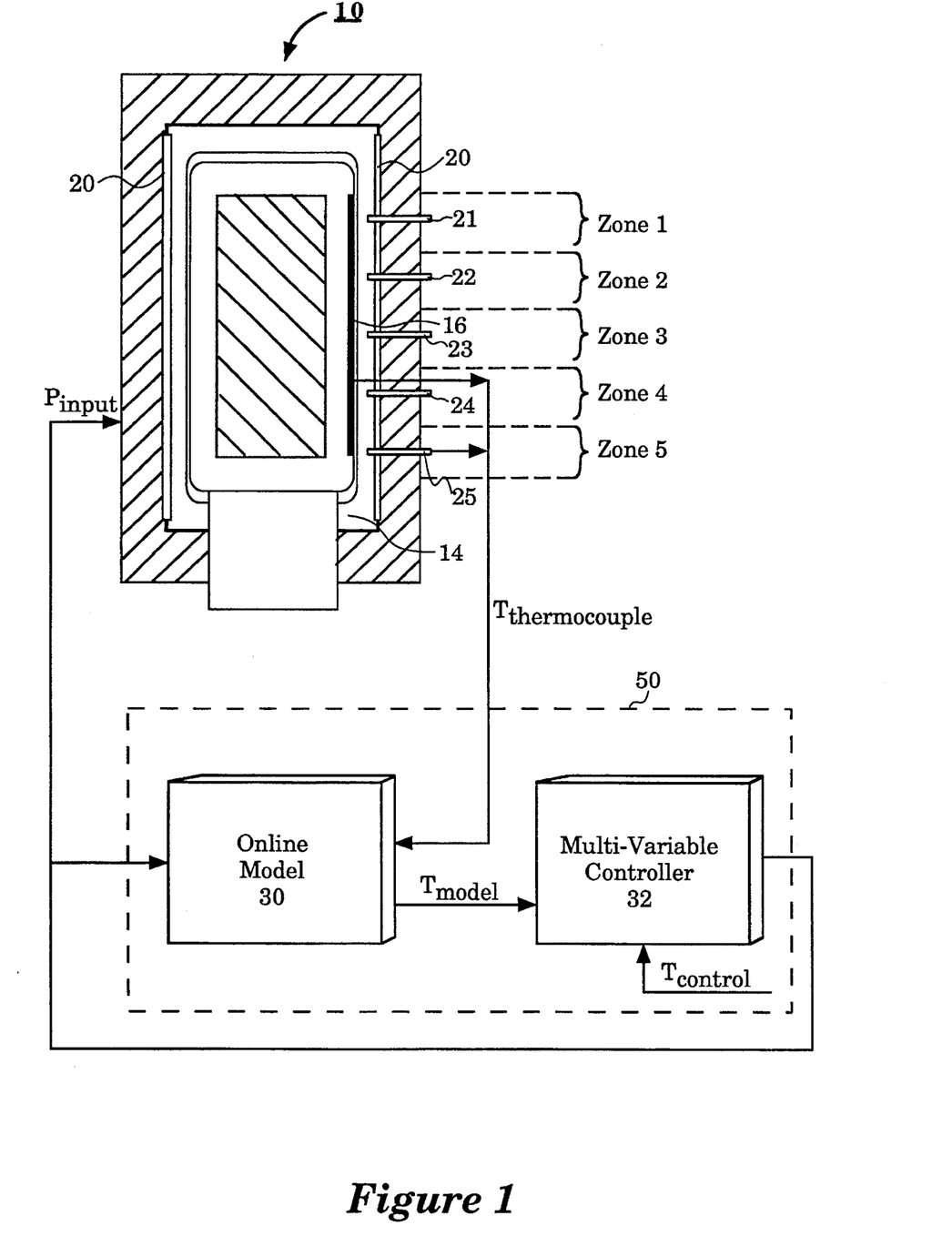
FIG. 1 illustrates a thermal reactor system for one embodiment that includes a thermal reactor and a reactor control system that includes an online model and a multi-variable controller.

FIG. 1 illustrates a thermal reactor system for one embodiment that includes a thermal reactor 10 and a reactor control system 50. The thermal reactor 10 contains one or two quartz jars 14 that houses a wafer load 12. The wafer load 12 comprises a set of silicon wafers supported by a quartz structure and distributed along the major axis of the thermal reactor 10 within the quartz jar 14.

The thermal reactor 10 also contains a set of heating elements 20. A set of profile thermocouples 16 are shown next to an interior wall of the quartz jar 14. For another embodiment, the profile thermocouples 16 are between the two walls of the quartz jar 14. For yet another embodiment, the profile thermocouples 16 are next to the wafer load.

For one embodiment, the heating elements 20 comprise a set of 5 separately controllable heating elements that subdivide thermal reactor 10 into a set of heater zones 1–5. The temperature of each heater zone 1–5 is sensed by a set of corresponding spike thermocouples 21–25. In addition, the profile thermocouples 16 comprises a set of thermocouples that sense profile temperatures for each of the heater zones 1–5.

The reactor control system 50 comprises an online model 30 and a multi-variable controller 32. The online model 30 obtains measurements from the spike thermocouples 21–25 and the profile thermocouples 16 from the thermal reactor 10. The measurements from the spike thermocouples 21–25 and the profile thermocouples 16 are referred to as $T_{thermocouple}$. The online model 30 also obtains measurements of the thermal reactor input power $P_{input}$ to the thermal reactor 10.

The online model 30 implements a thermal model of the thermal reactor 10. The thermal model of the online model 30 generates estimated wafer temperatures $T_{model}$ from the thermal reactor power input $P_{input}$ and the spike and profile thermocouple measurements $T_{thermocouple}$.

The multi-variable controller 32 generates the thermal reactor input power $P_{input}$ from the estimated wafer temperatures $T_{model}$ and a recipe set point or time-varying trajectory $T_{control}$. The multi-variable controller 32 implements a set of transfer functions that use the recipe set point or time-varying trajectory $T_{control}$ and the estimated wafer temperatures $T_{model}$ to generate the thermal reactor input power $P_{input}$ to minimize the end of run physical parameters for the structures formed on the wafer load 12.

Figure 2:
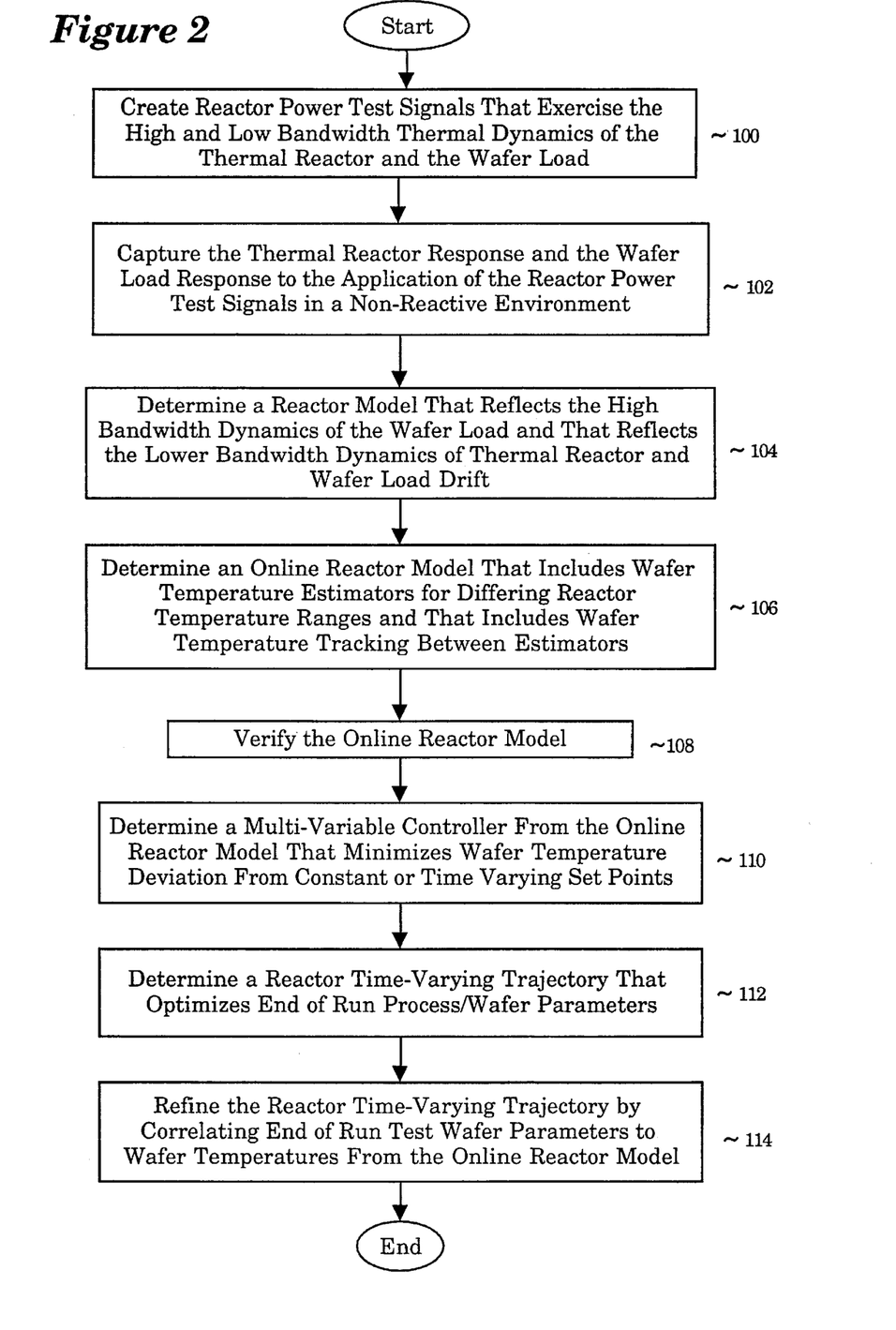
FIG. 2 illustrates a process for designing the reactor control system for one embodiment.

FIG. 2 illustrates a process for designing the reactor control system 50 for one embodiment. The online model 30 is generated by initially determining a thermal dynamic model of the thermal reactor 10 during process steps 100–108.

At process step 100, a set of reactor power test signals are created for characterizing the thermal behavior of the thermal reactor 10. The reactor power test signals are referred to as $P_{test}$. The reactor power test signals $P_{test}$ are designed to exercise the high and the low bandwidth thermal dynamics of the thermal reactor 10 and the wafer load 12. The reactor power test signals $P_{test}$ are created to provide sufficient excitation and richness to uncover the thermal behavior of the thermal reactor 10 for timescales from 20–30 seconds up to several hours.

At process step 102, the reactor power test signals $P_{test}$ are applied to the thermal reactor 10 while the response of the thermal reactor 10 and the response of the wafer load 12 are synchronously captured.

To capture both low frequency and high frequency components of the dynamics, for one embodiment, the test signals $P_{test}$ consist of pseudo-random binary sequence, simultaneously in each heater zone of the thermal reactor 10, such that the heater power changes no faster than every five minutes and the wafer temperature changes no more than 15 degrees from the nominal. The test signal keeps the wafer temperature around the nominal for three hours. In an alternative embodiment, the test signals $P_{test}$ consists of step inputs of 15 degrees lasting 10 minutes to a cascade profile PID controller 61 dwelling around the nominal value for three hours as shown in FIG. 3b.

Figure 3A:
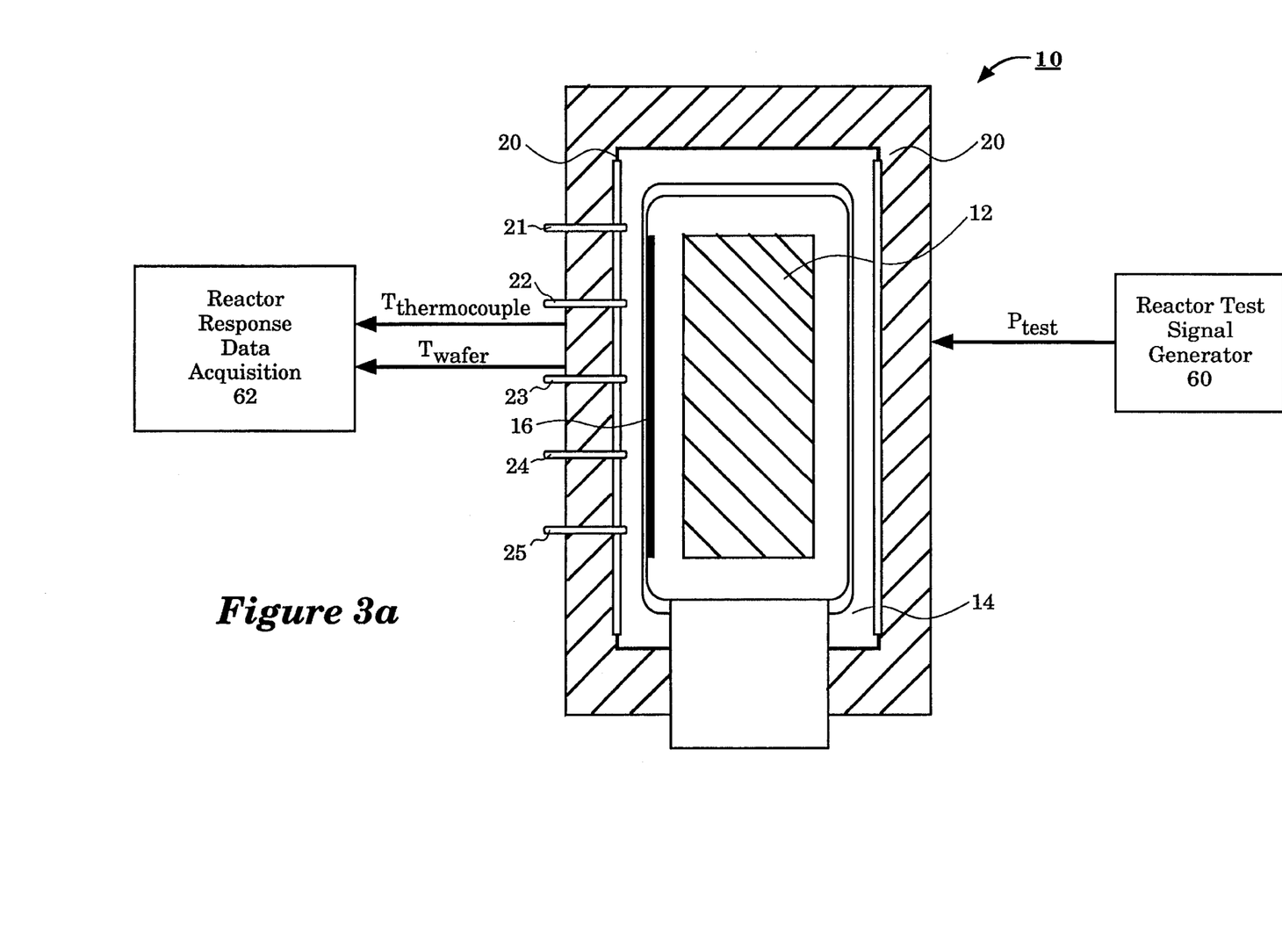
FIGS. 3a–3b illustrate alternative embodiments of the application of the reactor power test signals to the thermal reactor in a nonreactive environment while synchronous reactor and wafer load responses are gathered.
Figure 3B:
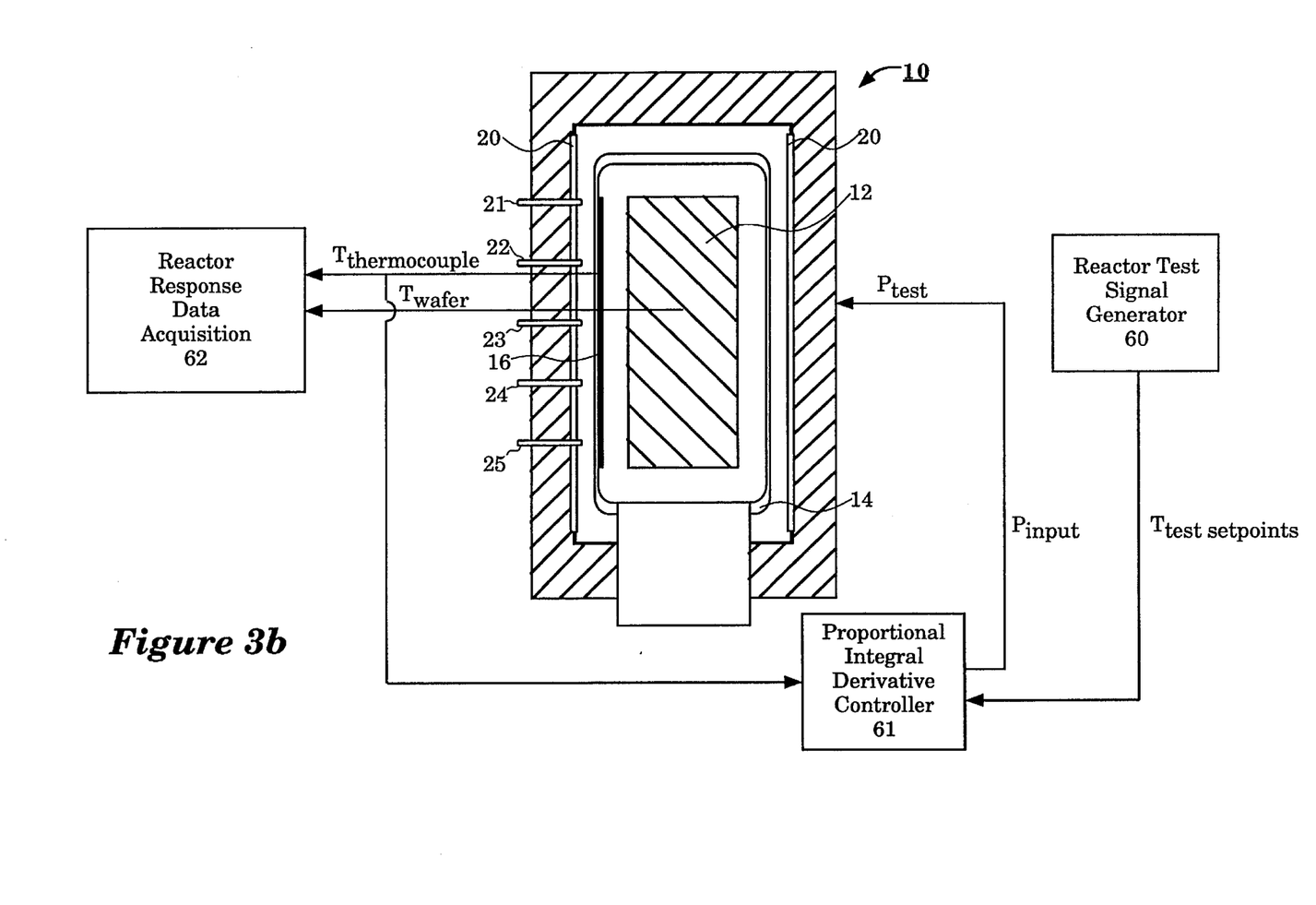

FIG. 3a is a diagram that illustrates process step 102 for one embodiment. At process step 102, the reactor power test signals $P_{test}$ are generated by a reactor test signal generator 60. During process step 102, the quartz jar 14 is filled with an inert gas such as nitrogen or argon to provide a nonreactive environment for the wafer load 12. In addition, wafer thermocouples (not shown) are placed on the wafer load 12 and are distributed through each of the heater zones 1–5.

A reactor response data acquisition unit 62 obtains measurements $T_{thermocouple}$ from the spike thermocouples 21–25 and the profile thermocouples 16 of the thermal reactor 10. In addition, the reactor response data acquisition unit 62 obtains measurements $T_{wafer}$ from the wafer thermocouples. The reactor response data acquisition unit 62 captures the measurements $T_{thermocouple}$ and $T_{wafer}$ synchronously as the reactor test signal generator 60 generates the reactor power test signals $P_{test}$.

The measurements of the reactor response data acquisition unit 62 are synchronous in time with a sample rate of between 1 and 5 seconds for one embodiment. The sample rate is sufficient to capture the thermal dynamic behavior of the thermal reactor 10 and the wafer load 12 for the timescales of interest.

For one embodiment, the reactor power test signals $P_{test}$ control the heating elements of each heater zones 1–5. For other embodiments, the reactor power test signals $P_{test}$ also control the flow rates and pressure of the inert gas inside the quartz jar 14.

At process step 104, a reactor model for the thermal reactor 10 is determined from the thermal reactor response indicated $T_{thermocouple}$ and the wafer load response indicated $T_{wafer}$ captured at process step 102. The reactor model is determined in a manner to reflect the high bandwidth thermodynamics of the wafer load 12 as well as the lower bandwidth thermal drift of the thermal reactor 10 and the wafer load 12.

The reactor model is determined by initially computing a set of high order auto regressive with exogenous inputs (ARX) model parameters at differing temperatures $T_{nominal, i}$. For one embodiment, the differing temperatures $T_{nominal, i}$ of the high order ARX model comprise 400°, 500°, 600° ... through 1100° C.

A high order Multi-Input-Output ARX model consists of the following equations:

$$y_t + AA_1 y_{t-1} + \ldots + AA_n y_{t-n} = BB_1 u_{t-1} + \ldots BB_n u_{t-n} + \epsilon_t$$

where $y_t$ is a vector of outputs at time t dimensioned p×1. In one embodiment $y_t$ comprises the five profile thermocouple signals, the five spike thermocouple signals and ten wafer thermocouple signals. The ten wafer thermocouple signals correspond to five instrumented Silicon wafers located at the same axial positions in the thermal reactor 10 as the profile thermocouples in the 200 mm diameter wafer load 12. Each instrumented wafer of the wafer load 12 has one thermocouple at the center and one thermocouple 6 mm away from the edge of the wafer. The signals are expressed as perturbations in degrees C. from corresponding steady-state values $Y_{bias}$.

The term $u_t$ is a vector of inputs at time t dimensioned m×1. In one embodiment, $u_t$ comprises the perturbations of five heater inputs around corresponding steady-state values $u_{bias}$ at time t.

$\epsilon_t$ is vector of independent white noise at time t dimensioned p×1. The matrices are dimensioned as $AA_j$:p×p, and $BB_j$:p×m. In one embodiment, the number of lags n is eight.

For one embodiment, the coefficients of the ARX model are computed using least-squares parameter estimation procedure.

Unlike standard multi-variable time-series regression methods, where the number of lags n are determined by the significance of the reduction in residual errors using the F-ratio test, the preferred embodiments use significance of reduction in estimation error in wafer temperatures. This estimation of wafer temperature uses a Kalman filter for prediction of wafer temperatures from only the heater powers, profile and spike thermocouple signals. Using the F-ratio test on the ARX residual errors leads to poor on-line prediction of wafer temperatures.

A state-space realization of the ARX model in the standard form is given by:

$$x_{t+1} = Ax_t + Bu_t + K_f \epsilon_t$$

$$y_t = Cx_t + \epsilon_t$$

where the matrices are:

$$A = \begin{bmatrix} -AA_1 & I_p & \cdots & 0 \\ \cdot & \cdot & & \cdot \\ \cdot & \cdot & \cdot & \cdot \\ \cdot & \cdot & & \cdot \\ -AA_n & 0 & \cdots & I_p \end{bmatrix}$$

$$B = \begin{bmatrix} BB_1 \\ \cdot \\ \cdot \\ \cdot \\ BB_n \end{bmatrix}$$

$$K_f = \begin{bmatrix} -AA_1 \\ \cdot \\ \cdot \\ \cdot \\ -AA_n \end{bmatrix}$$

$$C = [I_p \cdots 0]$$

In one embodiment, n=8, p=20, m=5, and $n_t$, the dimension of state vector $x_t$ is 160.

The covariance $R_\epsilon$ of $\epsilon_t$ is estimated from the actual residual error sequence obtained during parameter estimation. The disturbance model is embedded in these matrices and the innovations covariance $R_\epsilon$.

To compute an on-line model that provides an estimate of the wafer temperatures $T_{wafer}$ from $T_{thermocouple}$ and $P_{input}$, a Kalman filter is designed. First the output vector $y_t$ is divided into the measurable and the non-measurable parts as follows:

$$y_t = \begin{bmatrix} s_t \\ w_t \end{bmatrix}$$

The vector $s_t$ corresponds to the measured temperatures and is of dimension p1×1, the vector $w_t$ corresponds to the unmeasured temperatures and is of dimension p2×1. In one embodiment, p1=10 and p2=10. Correspondingly, the output matrix C and the bias vector $y_{bias}$ are partitioned as $$C = \begin{bmatrix} C_s \\ C_w \end{bmatrix}, \text{ and } y_{bias} = \begin{bmatrix} s_{bias} \\ w_{bias} \end{bmatrix}$$

where the matrix $C_s$ is of dimension $p_1 \times n_t$ and the matrix $C_w$ is of dimension $p_2 \times n_t$. The Kalman filter is obtained using the following signal model:

$$x_{t+1} = Ax_t + Bu_t + K_f \epsilon_t$$

$$s_t = C_s x_t + [I_{p_1} 0] \epsilon_t$$

A time-invariant Kalman filter is obtained by solving the following steady state Riccati equation $$A^TXA-X-A^TXC_s(Q_v+C_sXC_s)^{-1}Q_w=0$$

The process noise covariance is obtained from ARX model parameters as $Q_w=K_F^T R_\epsilon K_F$ and the measurement noise covariance is obtained as $$Q_v = [I_{p1} \quad 0] R_\epsilon \begin{bmatrix} I_{p1} \\ 0 \end{bmatrix}$$

From the Riccati solution, X, the Kalman filter gain matrix is given by, $L=XC^T(Q_v+CXC^T)^{-1}$ and the Kalman filter equations are given by:

$$\hat{x}_{t+1}=A\hat{x}_t+B(P_{input,t}+u_{bias})+L(T_{Thermocouple,t}-C_s\hat{x}_t+s_{bias})T_{model,t}=C_w\hat{x}_t+W_{bias}$$

The high order model ARX model parameters are determined in order to accurately characterize the high bandwidth thermal dynamics of the thermal reactor 10. Accordingly, the high order ARX model is chosen having orders of over one hundred and provides over one hundred time lagged variables that indicate the thermal behavior of the thermal reactor 10. In addition, the high order ARX model parameters are determined to retain noise and disturbance thermal dynamics of the thermal reactor 10. The high orders of the ARX model parameters at the differing temperatures ensures that the slow dynamic drift in the heating of the quartz jar 14 and the slow dynamics of the heating elements 20 as well as the slow dynamics of the heating of the wafer load 12 are accurately reflected in the reactor model. In addition, the high orders of the ARX model parameters enable the reactor model to accurately reflect the faster thermal dynamics that occur within the wafer load 12.

The initially computed set of high order ARX model parameters at each temperature $T_{nominal,i}$ is then reduced from over hundred states down to tens of states. Such model reduction results in increased efficiency of computation in subsequent steps of the design process. In addition, such model reduction eliminates numerical illconditioning arising from poorly observable and controllable states. In one embodiment Balanced Model Reduction techniques are used for obtaining reduced order models. An alternative is to use Schur method based model reduction techniques. For model reduction only the input output behavior is considered. For one embodiment, the reduced order ARX model parameters at each temperature $T_{nominal,i}$ are obtained in state-space form including matrices $A_i$, $B_i$, $C_{w,i}$ and $C_{s,i}$ that describe the time evolution of the internal states $x_i$, which consists of the time lagged variables that indicate the thermal behavior of the thermal reactor 10.

Each set of such reduced order ARX parameters gives a sub-model $MOD_i$ that accurately describe thermal behavior of the thermal reactor 10 in a temperature range $T_{range,i}$. For one embodiment, the temperature ranges are 350°–450°, 450°–550°, ... through 1050°–1150° C. The state update equation for each $MOD_i$ at time index t+1 is given by $$x_{i,t+1}=A_i x_{i,t}+B_i u_t$$

$$y_{i,t}=C_i x_{i,t}$$

A reactor model is obtained by switching the sub-models $MOD_i$ in their respective range of validity to obtain a single output vector $y_t$. Conventional gain-scheduling requires identical internal representations $x_i$ at each operating temperature $T_{nominal,i}$. However, high order or reduced order ARX models do not have a unique internal representation requiring on-line computation of initial conditions at the time of switching. For this purpose each model $MOD_i$ implements a fast tracking function that tracks the thermal behavior of the currently valid model outside its valid temperature range $T_{range,i}$. The fast tracking function of the models prevents the occurrence of a large transient as the temperature of the thermal reactor transitions between the valid ranges of the models. In terms of the reduced order ARX model parameters at each temperature $T_{normal,i}$, i the state update equations are modified to:

$$x_{i,t+1}=A_i x_{i,t}+B_i u_t+K_i(y_t+C_i x_{i,t})\delta_{switch,i}$$

The switch parameter $\delta_{switch,i}$ is zero when $MOD_i$ is in its valid temperature $T_{range,i}$ and one otherwise. In one embodiment, the gain matrix $K_i$ is obtained by pole placement to ensure fast tracking.

At process step 106 an online reactor model is determined from the reduced order ARX model calculated at process step 104. The online reactor model determined at process step 106 is implemented in the online model 30 of the reactor control system 50 to generate estimates of wafer load 12 temperatures and other internal temperatures.

Figure 4:
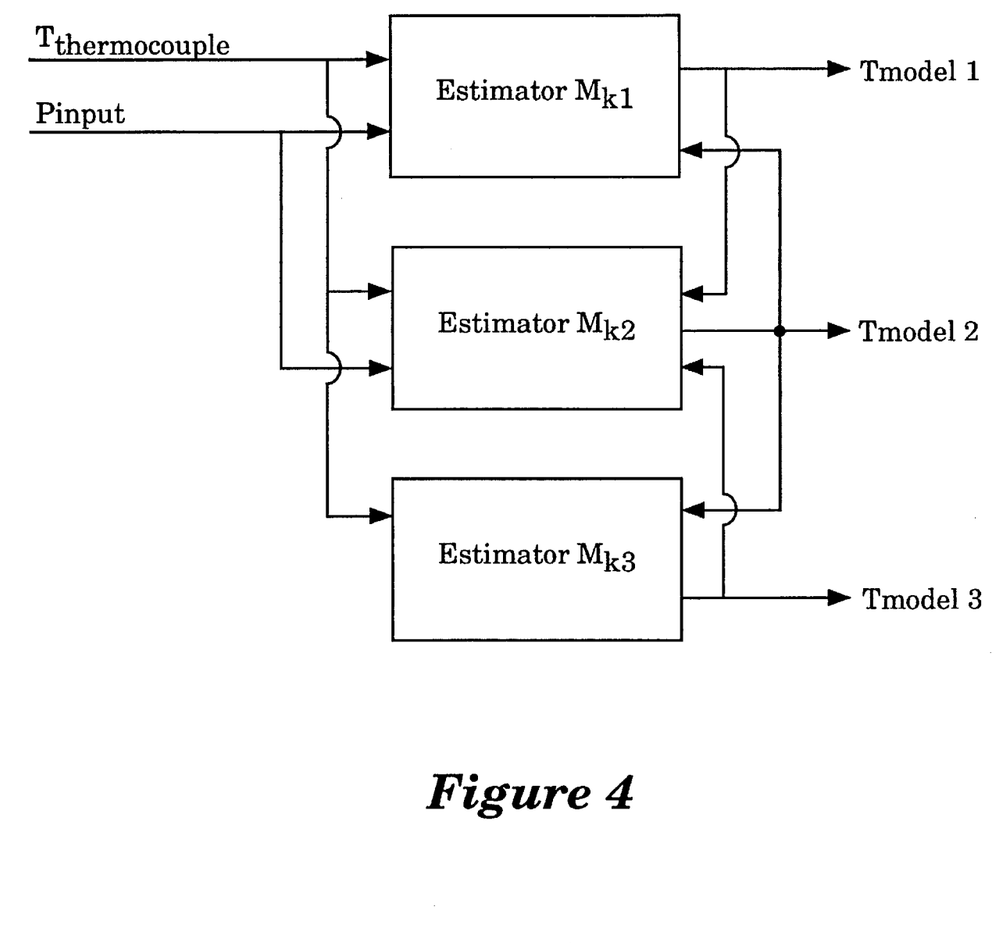
FIG. 4 is a simplified illustration of the online reactor model which includes a set of wafer temperature estimators that correspond to differing reactor temperature ranges.

FIG. 4 is a simplified illustration of the online reactor model. The online reactor model includes a set of wafer temperature estimators $M_{Ki}$. For purposes of illustration consider estimaters $M_{K1}$–$M_{K3}$. Each estimator $M_{K1}$–$M_{K3}$ corresponds to a differing reactor temperature range. For example, the estimator $M_{K1}$ corresponds to the temperature range 500°–600° C., the estimator $M_{K2}$ corresponds to the temperature range of 600°–700° C., and the estimator $M_{K3}$ corresponds to the temperature range of 700°–800° C.

Each estimator $M_{K1}$–$M_{K3}$ generates an estimated temperature of the wafer load 12 for the corresponding temperature range. For example, the estimator $M_{K1}$ generates the estimated wafer temperature $T_{model1}$ valid in the temperature range between 500°–600° C. Similarly, the estimator $M_{K2}$ generates the estimated wafer temperature $T_{model2}$ valid in the temperature range between 600°–700° C., and the estimator $M_{K3}$ generates the estimated wafer temperature $T_{model3}$ valid in the temperature range between 700°–800° C.

The estimators $M_{K1}$–$M_{K3}$ generate the estimated wafer temperatures $T_{model1}$ through $T_{model3}$ based upon the spike and profile thermocouple measurements from the thermal reactor 10 and the input power $P_{input}$ to the thermal reactor 10 based on the following equation:

$$\hat{x}_{i,t+1}=A_i \hat{x}_{i,t}+B_i(P_{input,t}-u_{bias,i})+L_i(T_{thermocouple,t}-C_{s,i}\hat{x}_{i,t}+s_{bias,i})T_{model,i,t}=C_{w,i}\hat{x}_{i,t}$$

In general, the gain matrices $L_i$ are obtained by solving steady-state Riccati equations using the reduced order ARX model parameters as described at process step 104. Alternatively, a time varying Kalman filter may be generated. However, time varying Kalman filters are computationally expensive to solve in an online system or would require large amounts of data storage if computed off-line and stored in the reactor control system 50.

For one embodiment, the estimated wafer temperatures are obtained by switching the estimators $M_{Ki}$ in their respective range of validity to obtain $T_{model}$. Conventional gain scheduling requires identical internal representation at each operating point. Reduced order models or high order ARX models do not have a unique internal representation. Switching the entire estimator controller structure or only the estimator without tracking lead to large transients on switching.

To minimize transients on switching, each of the estimators $M_{K1}$–$M_{K3}$ implement a fast tracking function that tracks the estimated wafer temperature generated outside the corresponding valid temperature range. The fast tracking functions of the estimators $M_{K1}$–$M_{K3}$ prevent the occurrence of large transients as the temperature of the thermal reactor 10 transitions between the valid ranges of the estimators $M_{K1}$–$M_{K3}$.

For example, the estimator $M_{K1}$ and the estimator $M_{K3}$ lock onto and track the estimated wafer temperatures $T_{model2}$ while the temperature of the thermal reactor 10 is within the valid range of the estimator $M_{K2}$. Similarly, the estimator $M_{K2}$ tracks the estimated wafer temperatures generated by the estimator $M_{K1}$ or the estimator $M_{K3}$ according to the relationship between the temperature of the thermal reactor 10 and the valid ranges of the estimators $M_{K1}$–$M_{K3}$. The fast tracking function is implemented as follows:

$$\hat{x}_{i,t+1} = A_i \hat{x}_{i,t} + B_i(P_{input,t} - u_{bias,i}) + L_i(T_{Thermocouple,i} - C_s \hat{x}_{i,t} + s_{bias,i})(1 - \delta_{switch,i}) + F_i(y_t - C_s \hat{x}_{i,t} + s_{bias,i}) \delta_{switch,i}$$

The switch parameter $\delta_{switch,i}$ is zero when $MK_i$ is in its valid temperature $T_{range,i}$ and one otherwise. In one embodiment, the gain matrix $F_i$ is obtained by pole placement to ensure fast tracking.

Figure 5:
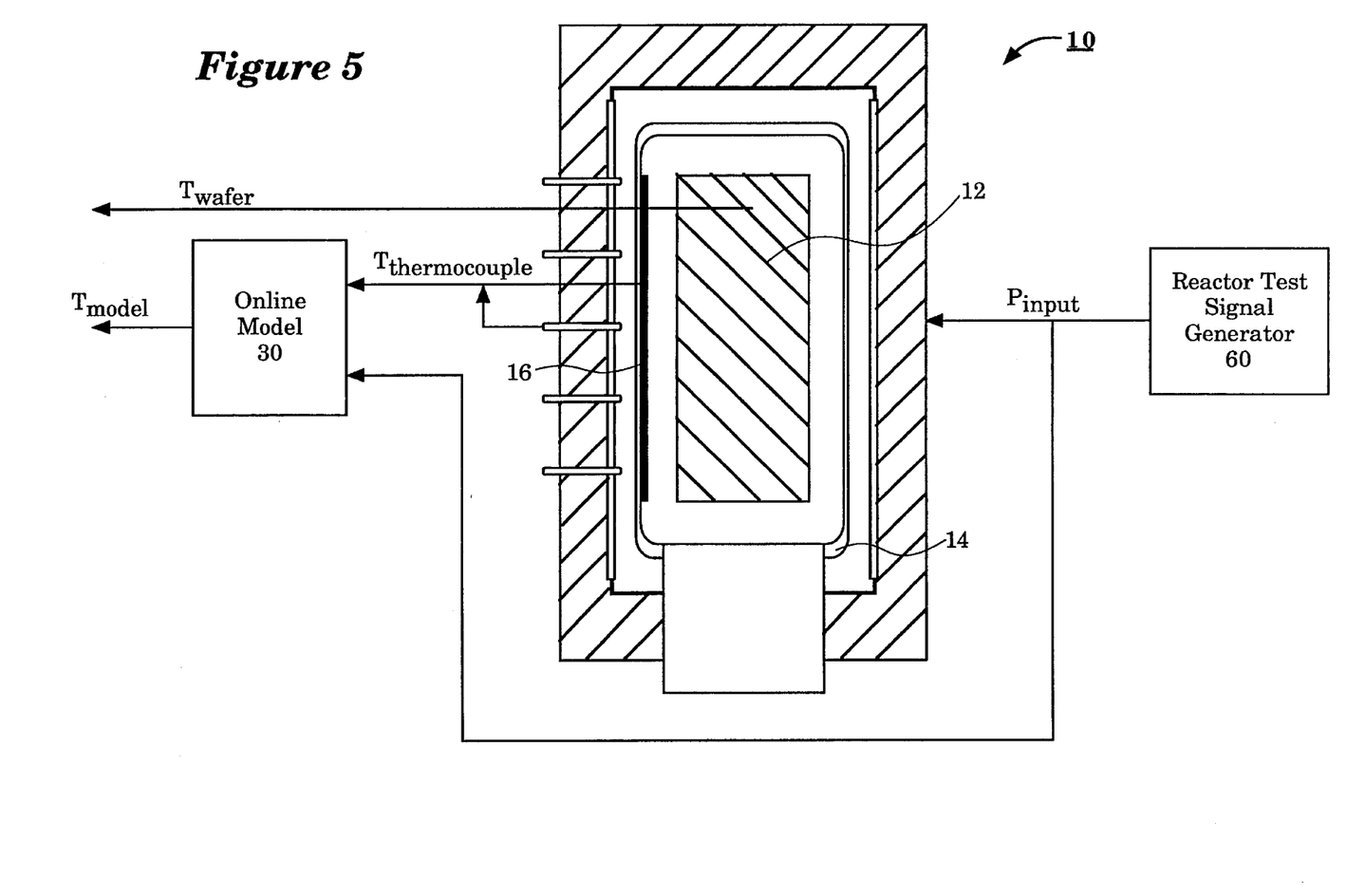
FIG. 5 illustrates the verification of the online reactor model, wherein the reactor test signal generator generates input power signals while the online model generates estimated wafer temperatures which are compared to thermocouple measurements.

FIG. 5 illustrates the verification of the online reactor model at process step 108. The reactor test signal generator 60 generates input power signals $P_{input}$ to the thermal reactor 10. In addition, the online model 30 receives the reactor power input control $P_{input}$ from the reactor test signal generator 60. The online model 30 also receives the spike and profile thermocouple measurements $T_{thermocouple}$ from the thermal reactor 10. The online model 30 generates estimated wafer temperatures $T_{model}$ using the estimators $M_{K1-MK3}$. At process step 108, the estimated wafer temperatures $T_{model}$ are compared to the wafer temperature measurements $T_{wafer}$ obtained from the thermal couples mounted on the wafer load 12.

At process step 110, a multi-variable controller is determined from the online reactor model. The multi-variable controller determined at process step 110 is implemented in the multi-variable controller 32 of the reactor control system 50. The multi-variable controller employs the interaction of heater powers in the differing heater zones 1–5 of the thermal reactor 10 to minimize the time average of wafer temperature deviation from the set point 46 at all locations of the wafer load 12. The set point 46 may be a constant set point or a time varying trajectory.

Process step 110, involves an off-line design procedure for computing a set of multi-variable controller equations given the online model determined at process step 106. The controller equations are calculated to minimize the average wafer temperature deviation in the wafer load 12. The process step 110 involves solving a set of steady state Ricatti equations for multi-variable control while testing for robustness and transient response. In addition, the weights of the Ricatti equations are modified to meet the robustness and transient response requirements. Alternative embodiment uses frequency weighted $H_\infty$ controllers and optimal $\mu$ controllers For one embodiment, the process step 110 is accomplished using reduced order ARX models. The multi-variable controller 32 determines the appropriate thermal reactor power signals $P_{input}$ given the set point 46 and the estimation of wafer temperatures $T_{model}$. The set point 46 provide a process control recipe for forming structures in the wafer load 12. Alternatively, the set points 46 provide a time varying trajectory for optimizing end of run wafer parameters on the wafer load 12.

At process step 112, a time varying set point trajectory is determined that optimizes end of run physical parameters for structures formed on the wafer load 12. The time varying temperature set point trajectory is referred to as $T_{traj}(t)$. Time varying trajectories are determined to exploit the fact that temperature gradients occur within the thermal reactor 10. For example, a temperature gradient occurs along the length of the wafer load 12 along the major axis of the thermal reactor 10. In addition, radial temperature gradients occur on each silicon wafer of the wafer load 12.

Figures 6, 7:
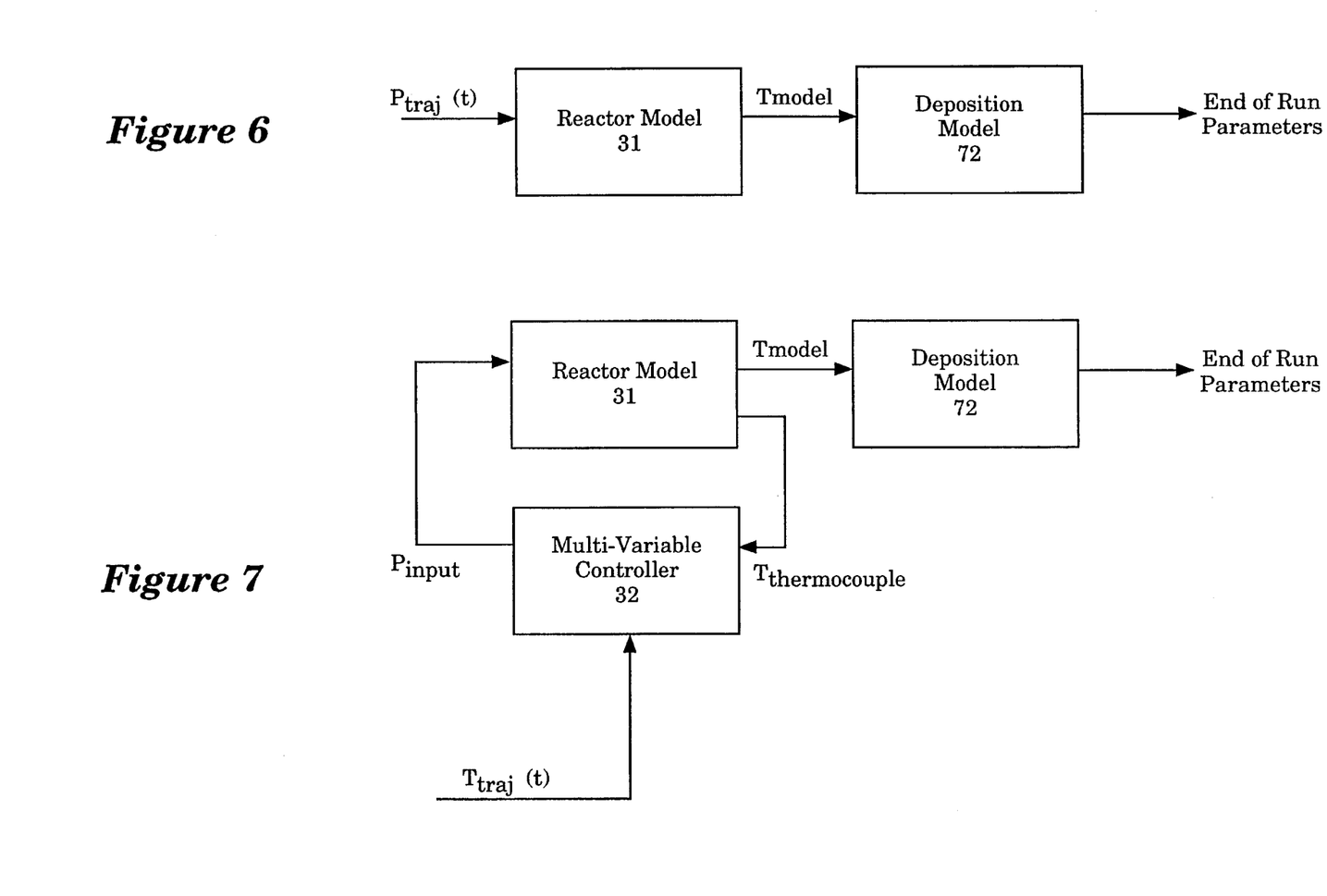
FIG. 6 is a diagram that illustrates the computational models that relate the end of run physical wafer parameters such as oxide thickness, poly thickness, and diffused dopant density to the wafer temperatures and gas flows on the wafer load during processing.
FIG. 7 illustrates a closed loop online implementation of a time varying set point trajectory that minimizes end of run wafer parameter variation.

FIG. 6 illustrates the computational models employed at process step 112. A deposition model 72 relates the end of run physical wafer parameters such as oxide thickness, poly thickness, and diffusion density to the wafer temperatures on the wafer load 12 during deposition.

In synthesizing recipes that minimize variations in deposition uniformity in thermally activated processes, it is customary to use constant temperatures during growth or deposition. Consider a growth or deposition equation with an Arrhenius temperature dependence:

$$\text{rate} = \exp(-E_A/kT)$$

For small temperature deviations from nominal, the deviation of end-of-run film thickness $\nabla d_{ox}$ is given by:

$$\frac{\nabla d_{ox}}{d_{nom}} = \frac{E_A}{kT_{nom}^2} \int_0^{tf} (T(t) - T_{nom}) dt$$

i.e., proportional to time average of temperature deviation during deposition or growth.

The steady-state temperature of growing film in a reactor at various locations can be changed by steady-state temperature deviations are limited in their degrees of freedom to the number of independently actuated heaters. The best achievable uniformity is then limited by steady-state design of the reactor geometry and insulation. Provided an accurate model of thermal behavior of the furnace is created, non-steady-state heater powers and non-steady temperatures during growth can be used to remove the limitations of steady-state behavior. As an illustration, if there is only one heater in a reactor, only one dimensional variation in steady-state temperature and the corresponding deposition profile is possible. With the same heater, however, if we allow time varying temperatures during deposition, very high dimensional small signal variations in the time averaged temperature at the end of growth or deposition are possible. Practical limitation on the dimensionality and size of such variations comes from bandwidth of allowable time variations in temperature due to inaccurate thermal models, limited heating and cooling authority and thermal stress limits.

To formally evaluate what is achievable and what kind of trajectory optimization problems will be well posed we proceed as follows. We start with a Method-Of-Lines model of thermal behavior of the reactor from standard radiation-conduction formulae as described in H. E. WAARD and W. L. Koning, "Optimal Control of the Wafer Temperatures in Diffusion/LPCVD furnaces", Automatica, vol. 28, no, 2, pp. 243–253, 1992. Such a model consists of a set of coupled first order non-linear differential equations. The dependent variables are temperatures of nodes of the model. These equations are linearized around the nominal constant deposition temperature for small temperature perturbations. The resulting system of time invariant differential equations are analyzed for reachability of the temperature states. Reachability analysis of temperature states of linearized radiation conduction thermal models reveal if temperature states are fully reachable. Axi-symmetric reactors analysis shows that radial and axial wafer/substrate temperatures are locally fully reachable for practical diffusion furnaces and Rapid Thermal Processors regardless of number of heaters. This, in turn, implies that time averaged axial and radial temperature deviations during growth can be varied arbitrarily at every node point. This, in turn, allows arbitrary small signal variation of deposition thickness at every node point.

In one embodiment, to compute precise temperature trajectories that actually minimize variations of oxide growth in a diffusion furnace we proceed as follows:

(1) Develop a model of the diffusion furnace using ARX models, and switching strategy.

(2) Devise a nominal set-point trajectory used with conventional recipe to bring the furnace close to the oxidation temperature.

(3) Compute the temperature state of the furnace model from a closed loop simulation up to start of the oxygen gas flow.

(4) Using the previously computed temperature state, solve a numerical optimization problem to minimize variations in computed oxide thickness in wafer load as a function of the set-point trajectory parameters.

$$\frac{d}{dt}(d_{ox}) = \frac{B}{A + 2d_{ox}} + K\exp(-d_{ox}/L)$$

$$\frac{B}{A} = \left(\frac{B}{A}\right)^i P_{O_2}^{.75}\eta_{HCl}$$

Activation Energies $$E_A = 2\text{eV for } \frac{B}{A}$$

$$E_A = 2.37\text{eV for } K$$

(5) Use the optimized time varying temperature set-point trajectory to drive the multi-variable controller on the reactor.

Therefore, the end of run wafer parameters can be arbitrarily changed within some bounds by changing the reactor power signals $P_{input}$ over time. The reactor model and the deposition model 72 are used to compute a time varying set point trajectory $T_{traj}(t)$ that minimizes variation in end of run parameters on the wafer load 12.

FIG. 7 illustrates a closed loop online implementation of a time varying set point trajectory that minimizes end of run wafer parameter variation. The multi-variable controller 32 uses spike and profile thermocouple measurements $T_{thermocouple}$ and the time varying reactor temperature trajectory $T_{traj}(t)$ to generate a reactor power signal $P_{input}$ to the thermal reactor 10. The reactor power signal $P_{input}$ is also used by the model 30 to generate estimated wafer temperatures $T_{model}$ for the deposition model 72 which indicates end of run parameters.

The time varying trajectories determined as process step 112 minimize the variation in final oxide thickness, poly thickness, sheet resistance, and junction depth on the wafer load 12.

The multi-variable control design models implemented in the multi-variable controller 32 fail when the input heater power to the thermal reactor 10 saturates. For one embodiment, the online model for the thermal reactor 10 is approximated by a pure integrator when the heater power for the thermal reactor 10 saturates. The reactor control problem is then solved as a minimum time problem with an estimation of final time in an application of feedback to recompute.

At process step 114 the time varying trajectory determined at process step 112 is refined. The time varying trajectory $T_{traj}(t)$ is refined by correlating the actual end of run parameters of test silicon wafers on the wafer load 12 to the estimated wafer temperatures $T_{model}$ determined from the online model 30.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for controlling a hot wall thermal reactor, comprising the steps of:

determining a reactor model that indicates a thermal behavior of the thermal reactor and a thermal behavior of a load contained in the thermal reactor wherein the load is identified by a plurality of nodes and the reactor model accounts for interaction among a set of heating zones of the thermal reactor;

determining an online reactor model from the reactor model, wherein the online reactor model estimates the thermal behavior of the load nodes based upon an online input power to the thermal reactor and upon an online temperature indication from the thermal reactor;

determining a multivariable controller from the online reactor model, wherein the multivariable controller minimizes temperature deviations of the load from a predetermined temperature recipe.

2. The method of claim 1 wherein the predetermined temperature recipe is computed using the reactor model and a deposition model.

3. The method of claim 1 wherein the predetermined temperature recipe is computed using the reactor model, the online reactor model, the multivariable controller and a deposition model.

4. The method of claim 2 or 3, further comprising the step of determining a time varying trajectory of the predetermined temperature recipe wherein non-steady-state temperatures may be utilized to minimize variations in a set of end of run physical parameters at each node location for a set of structures formed on the load.

5. The method of claim 2 or 3, further comprising the step of determining a time varying trajectory of the predetermined temperature recipe wherein non-steady-state temperatures may be utilized to minimize cycle time for a set of end of run physical parameters at each node location for a set of structures formed on the load.

6. The method of claim 2 or 3, further comprising the step of determining a time varying trajectory of the predetermined temperature recipe and a gas flow recipe wherein non-steady-state temperatures may be utilized to minimize variations in a set of end of run physical parameters at each node location for a set of structures formed on the load and that minimizes the cycle time for forming the structures.

7. The method of claim 6, wherein the end of run physical parameters for the structures include an oxide thickness, a polysilicon thickness, and a density of diffused dopants on the load.

8. The method of claim 1, wherein the step of determining a reactor model comprises the steps of:

creating a set of reactor power test signals that exercise high bandwidth and low bandwidth thermal dynamics of the thermal reactor and each node location of the load;

applying the test signals to the thermal reactor while capturing a synchronous thermal response of the thermal reactor and a synchronous thermal response of each node location of the load to the reactor power test signals;

determining a set of high order model parameters for the reactor model wherein the high order model parameters relate the reactor power test signals and the synchronous thermal response of the thermal reactor to the synchronous thermal response of each node location of the load.

9. The method of claim 8, wherein the step of capturing a synchronous thermal response of the thermal reactor and a synchronous thermal response of each node location of the load comprises the steps capturing a series of temperature measurements through a set of spike and profile thermocouples in the thermal reactor and capturing a series of temperature measurements through a set of thermocouples coupled to the load.

10. The method of claim 9, wherein the load comprises a silicon wafer load and wherein the structures form integrated circuit devices.

11. A thermal reactor system, comprising:

a thermal reactor containing a load that is identified by a plurality of nodes wherein the thermal reactor comprises a set of heating zones and a set of corresponding spike and profile thermocouples;

a reactor controller comprising an online reactor model that estimates the thermal behavior of each node location of the load based upon an online input power to the thermal reactor and upon an online temperature indication from the thermal reactor wherein the online reactor model is determined from a reactor model that indicates a thermal behavior of the thermal reactor and a thermal behavior of each node location of the load and that accounts for interaction among the heating zones, the reactor controller further comprising a multivariable controller determined from the online reactor model, wherein the multivariable controller minimizes temperature deviations of the load from a predetermined temperature recipe.

12. The thermal reactor system of claim 11, wherein the predetermined temperature recipe comprises a time varying trajectory that is computed using the reactor model and a deposition model and minimizes variations in a set of end of run physical parameters at each node location for a set of structures formed on the load.

13. The thermal reactor system of claim 11, wherein the predetermined temperature recipe comprises a time varying trajectory that is computed using the reactor model and a deposition model and minimizes cycle time for a set of end of run physical parameters at each node location for a set of structures formed on the load.

14. The thermal reactor system of claim 11, wherein the predetermined temperature recipe comprises a time varying trajectory of temperature and gas flow that is computed using the reactor model and a deposition model and minimizes variations in a set of end of run physical parameters at each node location for a set of structures formed on the load and that minimizes the cycle time for forming the structures.

15. The thermal reactor system of claim 14, wherein the end of run physical parameters for the structures include an oxide thickness, a polysilicon thickness, and a density of diffused dopants on the load.

16. The thermal reactor system of claim 15, wherein the load comprises a silicon wafer load and wherein the structures form integrated circuit devices.

17. The thermal reactor system of claim 11, wherein the predetermined temperature recipe comprises a time varying trajectory that is computed using the reactor model, the online reactor model, the multivariable controller and a deposition model and minimizes variations in a set of end of run physical parameters at each node location for a set of structures formed on the load.

18. The thermal reactor system of claim 11, wherein the predetermined temperature recipe comprises a time varying trajectory that is computed using the reactor model, the online reactor model, the multivariable controller and a deposition model and minimizes cycle time for a set of end of run physical parameters at each node location for a set of structures formed on the load.

19. The thermal reactor system of claim 11, wherein the predetermined temperature recipe comprises a time varying trajectory of temperature and gas flow that is computed using the reactor model, the online reactor model, the multivariable controller and a deposition model and minimizes variations in a set of end of run physical parameters at each node location for a set of structures formed on the load and that minimizes the cycle time for forming the structures.

20. A method for controlling a hot wall thermal reactor containing a load, comprising the steps of:

creating a set of reactor power test signals that exercise high bandwidth and low bandwidth thermal dynamics of the thermal reactor and the load;

applying the test signals to the thermal reactor while capturing a synchronous thermal response of the thermal reactor and a synchronous thermal response of the load to the reactor power test signals;

determining a set of high order model parameters wherein the high order model parameters relate the reactor power test signals and the synchronous thermal response of the thermal reactor to the synchronous thermal response of the load;

determining an online reactor model from the set of reactor model parameters, wherein the online reactor model estimates the thermal behavior of the load based upon an online input power to the thermal reactor and upon an online temperature indication from the thermal reactor; and determining a multivariable controller from the online reactor model, wherein the multivariable controller minimizes temperature deviations of the load from a predetermined temperature recipe.

21. The method of claim 20 further comprising the step of determining a time varying trajectory of the predetermined temperature recipe wherein non-steady-state temperatures may be utilized to minimize variations in a set of end of run physical parameters for a set of structures formed on the load.

22. The method of claim 20, further comprising the step of determining a time varying trajectory of the predetermined temperature recipe wherein non-steady-state temperatures may be utilized to minimize cycle time for a set of end of run physical parameters for a set of structures formed on the load.

23. The method of claim 20, further comprising the step of determining a time varying trajectory of the predetermined temperature recipe and a gas flow recipe wherein non-steady-state temperatures may be utilized to minimize variations in a set of end of run physical parameters for a set of structures formed on the load and that minimizes the cycle time for forming the structures.

24. The method of claims 21, 22 and 23, wherein the end of run physical parameters for the structures include an oxide thickness, a polysilicon thickness, and a density of diffused dopants on the load.

25. The method of claim 20, wherein the step of capturing a synchronous thermal response of the thermal reactor and a synchronous thermal response of the load comprises the steps capturing a series of temperature measurements through a set of spike and profile thermocouples in the thermal reactor and capturing a series of temperature measurements through a set of thermocouples coupled to the load.

26. The method of claim 20 wherein the load comprises a silicon wafer load and wherein the structures form integrated circuit devices.

27. A method for controlling a thermal reactor containing a load, comprising the steps of:

creating a set of reactor power test signals;

applying the test signals to the thermal reactor while capturing a thermal response of the thermal reactor and a thermal response of the load to the reactor power test signals;

determining a set of parameters wherein the parameters relate the reactor power test signals and the thermal response of the thermal reactor to the thermal response of the load; and determining an online reactor model from the set of parameters, wherein the online reactor model estimates the thermal behavior of the load based upon an online input power to the thermal reactor and upon an online temperature indication from the thermal reactor.

28. The method of claim 27 further comprising determining a multivariable controller from the online reactor model, wherein the multivariable controller minimizes temperature deviations of the load from a predetermined temperature recipe.

29. The method of claim 28 further comprising the step of determining a time varying trajectory of the predetermined temperature recipe wherein non-steady-state temperatures may be utilized to minimize variations in a set of end of run physical parameters for a set of structures formed on the load.

30. The method of claim 28 further comprising the step of determining a time varying trajectory of the predetermined temperature recipe wherein non-steady-state temperatures may be utilized to minimize cycle time for a set of end of run physical parameters for a set of structures formed on the load.

31. The method of claim 28 further comprising the step of determining a time varying trajectory of the predetermined temperature recipe and a gas flow recipe wherein non-steady-state temperatures may be utilized to minimize variations in a set of end of run physical parameters for a set of structures formed on the load and that minimizes the cycle time for forming the structures.

32. The method of claims 29, 30 and 31 wherein the end of run physical parameters for the structures include an oxide thickness, a polysilicon thickness, and a density of diffused dopants on the load.

33. The method of claim 27, wherein the step of capturing the thermal response of the thermal reactor and the thermal response of the load comprises the steps capturing a series of temperature measurements through a set of spike and profile thermocouples in the thermal reactor and capturing a series of temperature measurements through a set of thermocouples coupled to the load.

34. The method of claim 27 wherein the load comprises a silicon wafer load and wherein the structures form integrated circuit devices.

35. A method of determining the thermal response of a furnace, said method comprising the steps of:

applying power signals to the furnace while recording the thermal response of the furnace over time and recording the thermal response of a load within the furnace over time;

determining a set of model parameters wherein the parameters relate the power signals and the thermal response of the furnace to the thermal response of the load; and determining a furnace model from the set of model parameters, wherein the furnace model estimates the thermal behavior of the load based upon an input power to the furnace and upon an online temperature indication from the furnace.

36. The method of claim 35 further comprising the step of:

determining a multivariable controller from the furnace model, wherein the multivariable controller minimizes temperature deviations of the load from a predetermined temperature recipe.

37. The method of claim 36, further comprising the step of determining a time varying trajectory of the predetermined temperature recipe wherein non-steady-state temperatures may be utilized to minimize variations in a set of end of run physical parameters for a set of structures formed on the load.

38. The method of claim 36, further comprising the step of determining a time varying trajectory of the predetermined temperature recipe wherein non-steady-state temperatures may be utilized to minimize cycle time for a set of end of run physical parameters for a set of structures formed on the load.

39. The method of claim 36, further comprising the step of determining a time varying trajectory of the predetermined temperature recipe and a gas flow recipe wherein non-steady-state temperatures may be utilized to minimize variations in a set of end of run physical parameters for a set of structures formed on the load and that minimizes the cycle time for forming the structures.

40. The method of claims 37, 38 and 39 wherein the end of run physical parameters for the structures include an oxide thickness, a polysilicon thickness, and a density of diffused dopants on the load.

41. The method of claim 35, wherein the step of recording the thermal response of the furnace and the thermal response of the load comprises the steps capturing a series of temperature measurements through a set of spike and profile thermocouples in the furnace and capturing a series of temperature measurements through a set of thermocouples coupled to the load.

42. The method of claim 35 wherein the load comprises a silicon wafer load and wherein the structures form integrated circuit devices.

43. A method of fabricating a semiconductor comprising the steps of:

providing a load in a chamber wherein the load includes a plurality of substrates;

producing a thermal model of the load wherein each substrate is identified by a plurality of nodes; and varying the temperature of each node in accordance with a process recipe while growing a film on said substrates such that variations in a set of end run physical parameters is minimized at each node location.

44. The method of claim 43 wherein the process recipe is computed using the thermal model and a deposition model.

45. A method of fabricating a semiconductor comprising the steps of:

providing a load in a chamber wherein the load includes a plurality of substrates;

producing a thermal model of the load wherein each of the substrates is identified by a plurality of nodes; and varying the temperature of each node in accordance with a process recipe that is computed from the thermal model and a deposition model while depositing a film on each of said nodes such that variations in a set of end run physical parameters is minimized at each node location.

* * * * *

UNITED STATES PATENT AND TRADEMARK OFFICE
CERTIFICATE OF CORRECTION

PATENT NO. : 5,517,594
DATED : May 14, 1996
INVENTOR(S) : Shah et al.

It is certified that error appears in the above-identified patent and that said Letters Patent is hereby corrected as shown below:

In column 4 at line 12 delete "$T_{thermocoupte}$" and insert --$T_{thermocouple}$--

In column 4 at line 19 delete "$T_{therrnocouple}$" and insert --$T_{thermocouple}$--

In column 6 at line 7 delete "$Ax_t=Bu_t=$" and insert --$Ax_t+Bu_t+$--

In column 7 at line 14 delete "$(P_{input,t}+u_{bias})$" and insert --$(P_{input,t}-u_{bias})$--

In column 8 at line 7 delete "$T_{normal,i}$" and insert --$T_{nominal,i}$--

In column 9 at line 16 delete "$B_i$" and insert --$+B_i$--

Signed and Sealed this

Thirteenth Day of August, 1996

Attest:

BRUCE LEHMAN

Attesting Officer

Commissioner of Patents and Trademarks